United States Patent [19]

Nakayama et al.

[11] Patent Number: 4,783,380

[45] Date of Patent: Nov. 8, 1988

[54] METALLIZING COMPOSITION ON ALUMINA PORCELAIN

[75] Inventors: Yukito Nakayama; Masaaki Ito; Minato Ando, all of Aichi, Japan

[73] Assignee: NGK Spark Plug Co., Ltd., Japan

[21] Appl. No.: 93,289

[22] Filed: Sep. 4, 1987

[30] Foreign Application Priority Data

Sep. 5, 1986 [JP] Japan .................... 61-209214

[51] Int. Cl.$^4$ .............................. H01B 1/06
[52] U.S. Cl. .................... 428/702; 428/698; 428/901; 252/518
[58] Field of Search ............ 428/698, 699, 701, 702, 428/472; 252/518

[56] References Cited

U.S. PATENT DOCUMENTS

| 4,493,789 | 1/1985 | Ueyama et al. ............ 252/518 X |
| 4,574,056 | 3/1986 | Kemura ..................... 428/901 X |
| 4,645,621 | 2/1987 | Nair .......................... 252/518 X |

Primary Examiner—Nancy A. B. Swisher
Attorney, Agent, or Firm—Sughrue, Mion, Zinn, Macpeak, and Seas

[57] ABSTRACT

A metallizing composition consists of 100 parts by weight of tungsten as a main component, from 2 to 12 parts by weight of $Al_2O_3$, from 0.1 to 0.8 parts by weight of $Ta_2O_5$, from 0.3 to 1.5 parts by weight of $SiO_2$, and from 0.1 to 0.5 parts by weight in total of CaO and MgO as an additive.

3 Claims, 1 Drawing Sheet

METALLIZING COMPOSITION ON ALUMINA PORCELAIN

BACKGROUND OF THE INVENTION

1. Field of the Invention

The present invention generally relates to a metallizing composition and particularly relates to a metallizing composition for metallizing a surface of alumina porcelain which is used as an insulating material of electronic parts.

2. Prior Art

Having little high frequency loss, alumina porcelain is generally used for electronic parts such as MIC substrates, microwave transmissible window materials, electron tubes, etc., after metallizing ink is printed on the surface of the alumina porcelain thereby metallizing the alumina porcelain to form desired print circuits or the like. It is a matter of course that the higher the content of alumina the more superior alumina character the alumina porcelain has. However, there have been developed no metallizing compositions improved in airtightness and contact, and therefore at present only a combination of a metallizing composition composed of tungsten of 100 parts by weight and alumina of 3 parts by weight and porcelain of 92% alumina to the utmost, is put into practice.

In recent years, however, low loss materials are required as the communication frequency is shifted into a high-frequency band and as the frequency of magnetrons is made high. Accordingly, there have been strong demands on practical use of alumina porcelain having purity higher than 96% by weight which is conventional to electronic devices.

SUMMARY OF THE INVENTION

It is therefore an object of the present invention to satisfy the demands as described above.

It is another object of the present invention to provide a metallizing composition which can be applied to a porcelain containing alumina of 96% or more by weight and which is superior in airtightness and intimate contact.

In order to attain the above objects, according to the present invention, the metallizing composition contains 100 parts by weight of tungsten as a main component, from 2 to 12 parts by weight of $Al_2O_3$, from 0.1 to 0.8 part by weight of $Ta_2O_5$, from 0.3 to 1.5 parts by weight of $SiO_2$, and from 0.1 to 0.5 part by weight of CaO and MgO as an additive.

DETAILED DESCRIPTION OF THE INVENTION

Figure 1:
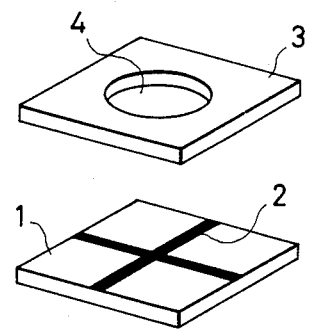
FIGS. 1, 2 and 3 are figures showing the steps of forming metallized surface on the surface of alumina porcelain and evaluating the airtightness.

Above and other objects, features and advantages of the present invention will appear more fully from the following description with reference to the accompanying drawings.

According to the present invention the metallizing composition contains 100 parts by weight of tungsten as a main component, from 2 to 12 parts by weight of $Al_2O_3$, from 0.1 to 0.8 part by weight of $Ta_2O_5$, from 0.3 to 1.5 parts by weight of $SiO_2$, and from 0.1 to 0.5 part by weight of CaO and MgO as an additive.

The reason why tungsten is contained as a main component is that, as is well known, tungsten provides superior heat-resisting property and is available to alumina porcelain even under a thermal expansion. The alumina $Al_2O_3$ in the above metallizing composition acts to ensure affinity between the metallizing layer and the alumina porcelain layer and to compensate for intimate contact therebetween. If the content of the alumina is less than 2 parts by weight, however, the contact compensation is not sufficient, while if the content is more than 12 parts by weight, the contact between a surface of plating and the metallized surface is badly affected to thereby lower the strength of brazing between th surface of plating and metal terminals. The tantalum pentoxide $Ta_2O_5$ produces a compound with calcia CaO or magnesia MgO and the compound acts to strengthen the contact between the metallizing layer and the alumina porcelain layer due to a dispersion of the reaction products over the alumina porcelain. If the content of $Ta_2O_5$ is less than 0.1 part by weight or if the content of CaO and MgO is less than 0.1 part by weight, the intimate contact can be insufficiently attained, while if the content of $Ta_2O_5$ is more than 0.8 part by weight, numbers of pores are produced between the metallizing layer and the alumina porcelain layer so that the airtightness and contact between the metallizing layer and the alumina porcelain layer are badly affected, and if the content of CaO and MgO is more than 0.5 part by weight, the contact between the metallizing layer and the alumina porcelain layer is badly affected. $SiO_2$, as well as CaO and MgO, acts to accelerate the sintering of tungsten thereby making the airtightness high. If the content of $SiO_2$ is less than 0.3 part by weight, however, the action of $SiO_2$ is not sufficient, while if the content is more than 1.5 parts by weight, the reaction between $Ta_2O_5$ and CaO or MgO is badly affected to thereby lower the strength of contact.

According to the present invention, the metallizing composition is preferably pulverized in as long as possible using, for example, a ball mill, to reach 0.5 to 0.7 μm of an average particle size.

Alumina porcelain balls to be used in the ball mill should have 99.99% or higher in purity since the alumina may be contaminated thereby, though an amount is extremely small.

The metallizing composition, after mixing with a binder, is formed in desired shape such as sheet and is sintered under a condition of relatively low dew point, for example, 15° C. In conventional operation, a sintering may be carried out at 40° C. of a dew point for the metallizing composition comprising 92% or lower of alumina.

The final sintered products according to the present invention show an excellent property, such as low electric resistance, high airtightness, strong contact between the metallizing surface and lead wire, etc.

The present invention is described in more detail with reference to the Examples, which are not to be construed as limiting the scope thereof.

EXAMPLES

Tungsten powder of an average grain size of 1.3 μm, alumina powder of an average grain size of 0.5 μm (purity of 99.99%), silicic acid anhydride of an average grain size of 0.5 μm (purity of 99.9%), calcium carbonate of an average grain size of 0.5 μm (special grade chemical) and magnesium carbonate of an average grain size of 0.5 μm (special grade chemical) were mixed in each amount such that the metallizing composition as shown in Table 1 may be obtained after firing to prepare various samples. Butyl carbitol of 50 g, acetone of 50 g, and ethyl cellulose of 10 g were added to the metallizing composition of 300 g, and the mixture was put in a polyethylene pot mill having an inner volume of 1 liter together with alumina porcelain balls of 1 kg in total weight, 99.99% in purity and 15 mm in diameter so that the whole wa mixed for 190 hours to obtain slurry. The slurry was transferred into an aluminum bowl and agitated under a nitrogen gas stream to volatilize the acetone to thereby making the slurry pasty. An attention was given to prevent oxidation of the composition.

Figure 2:
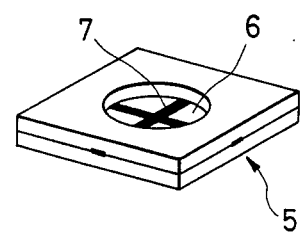

Separately, second slurry was prepared by adding a small quantity of organic binder to a ready mixed composition of inorganic powder composed of alumina of 99.8% by weight, silica of 0.1% by weight and magnesia of 0.1% by weight and by mixing them. The second slurry was molded to prepare two square sheets. The prepared paste was printed in thick film to form cross figure on the front surface of one of the two square sheets, and a circular hole was punched at the center of the other square sheet, as shown in FIG. 1 In FIG. 1, the reference numeral 1 designates the square sheet having no hole, 2 designates thick film of paste printed on the surface of the square sheet 1, 3 designates the punched square sheet, and 4 designates the hole punched in the square sheet 3. Then, the square sheets 1 and 3 were stacked and pressed to be bonded to each other to obtain a laminated sheet. The sheet was sintered in an atmosphere of ammonia cracked gas under the condition of a dew point of 15° C., a temperature of 1,630° C. and holding time of 2 hours to prepare such a squar laminated substrate 5 as shown in FIG. 2. Thus, the laminated substrate 5 was composed of two substrates and has a size of 11 mm × 11 mm × 5 mm. One of the substrates had a hole 6 of a diameter of 5 mm formed at the center thereof, and a cross-shaped metallized surface 7 having a width of 1 mm and a thickness of 10 μm was sandwiched between the two substrates. An airtightness evaluation test was performed on the laminated substrate 5 in such a manner as will be described later.

Next, the above-mentioned paste was printed in a form of a thick film on a surface of a square sheet of the same quality as the square sheet 1 and sintered under the same condition as that when the laminated substrate 5 was prepared, thereby preparing a square substrate 9 having a thickness of 2 mm on the surface of which a metallized surface 8 having a 2 mm square, 10 μm thick was formed. A contact evaluation test was performed on the square substrate 9 in such a manner as will be described later.

Airtightness Evaluation Test

Figure 3:
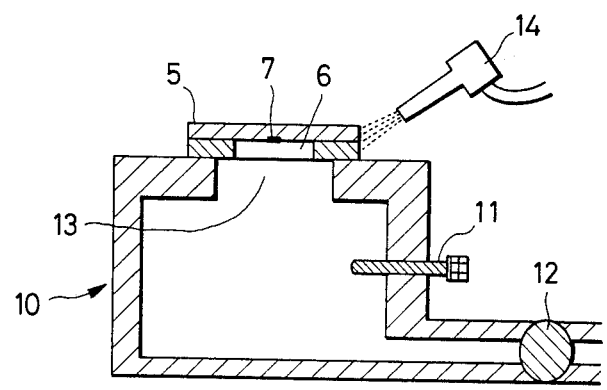

FIG. 3 is a schematic drawing showing a state where the airtightness evaluation test was performed. A container 10 is provided with a He-gas sensor 11 and a vacuum pump 12 attached thereon and has an opening 13 so that if the opening 13 is closed the container can be airtightly sealed. The laminated substrate 5 was attached to the opening 13 in a manner so that the metallized surface 7 faced the opening 13, thereby closing the opening 13. Then, the inside pressure of the container 10 was reduced to $10^{-6}$ Torr of vacuum and a He-gas was sprayed externally to the laminated substrate 5 through a nozzle 14 so that the airtightness was evaluated on the basis of the permeated quantity of the He-gas detected by the He-gas sensor 11.

Contact Evaluation Test

Figure 4:
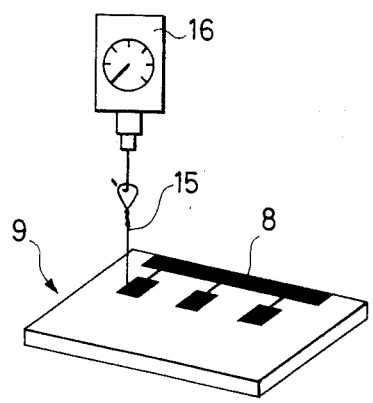
FIG. 4 is a figure showing the state where the contact of the metallized portion to alumina porcelain is being evaluated.

FIG. 4 is a figure showing a state where the contact evaluation test was performed on the square substrate 9 having the metallized surface 8. The metallized surface 8 was subject to electrolytic Ni plating to a thickness of 2 μm. A 0.6 mm dia lead wire 15 was soldered at one end to the plated surface and the other end of the lead wire was pulled by a spring balancer 16. The contact was measured on the basis of a value obtained by dividing the load when the metallized surface 8 peeled off from the square substrate 9 by the area of the metallized surface 8. With respect to all the samples, the peeling off occurred between the metallized surface 8 and the square substrate 9, and therefore it is considered that the Ni plating, soldering, etc., provided no influence on the contact.

The results of the above estimation tests are shown in the following Table 1.

TABLE 1

| No. | Metallizing Composition (part by weight) | | | | | | | Airtightness (cc/sec) | Contact (kg/mm$^2$) | Scope of Invention |
|---|---|---|---|---|---|---|---|---|---|---|
| | W | Al$_2$O$_3$ | Ta$_2$O$_5$ | SiO$_2$ | CaO | MgO | (CaO + MgO) | | | |
| 1 | 100 | 7 | 0.4 | 0.9 | 0.1 | 0.2 | 0.3 | $10^{-12}$ | 0.3 | Inside |
| 2 | 100 | 2 | 0.4 | 0.9 | 0.1 | 0.2 | 0.3 | $10^{-11}$ | 1.6 | Inside |
| 3 | 100 | 2 | 0.4 | 0.9 | 0.1 | 0.2 | 0.3 | $10^{-11}$ | 1.2 | Outside |
| 4 | 100 | 12 | 0.4 | 0.9 | 0.1 | 0.2 | 0.3 | $10^{-11}$ | 1.5 | Inside |
| 5 | 100 | 13 | 0.4 | 0.9 | 0.1 | 0.2 | 0.3 | $10^{-10}$ | 1.1 | Outside |
| 6 | 100 | 7 | 0.1 | 0.9 | 0.1 | 0.2 | 0.3 | $10^{-11}$ | 1.7 | Inside |
| 7 | 100 | 7 | 0.05 | 0.9 | 0.1 | 0.2 | 0.3 | $10^{-11}$ | 1.4 | Outside |
| 8 | 100 | 7 | 0.8 | 0.9 | 0.1 | 0.2 | 0.3 | $10^{-8}$ | 1.9 | Inside |
| 9 | 100 | 7 | 1.0 | 0.9 | 0.1 | 0.2 | 0.3 | $10^{-7}$ | 0.9 | Outside |
| 10 | 100 | 7 | 0.4 | 0.3 | 0.1 | 0.2 | 0.3 | $10^{-8}$ | 3.3 | Inside |
| 11 | 100 | 7 | 0.4 | 0.2 | 0.1 | 0.2 | 0.3 | $10^{-7}$ | 3.0 | Outside |
| 12 | 100 | 7 | 0.4 | 1.5 | 0.1 | 0.2 | 0.3 | $10^{-9}$ | 1.6 | Inside |
| 13 | 100 | 7 | 0.4 | 1.7 | 0.1 | 0.2 | 0.3 | $10^{-9}$ | 1.0 | Outside |
| 14 | 100 | 7 | 0.4 | 0.9 | 0.1 | 0.0 | 0.1 | $10^{-8}$ | 1.6 | Inside |
| 15 | 100 | 7 | 0.4 | 0.9 | 0.05 | 0.0 | 0.05 | $10^{-6}$ | 0.8 | Outside |
| 16 | 100 | 7 | 0.4 | 0.9 | 0.2 | 0.3 | 0.5 | $10^{-9}$ | 1.7 | Inside |
| 17 | 100 | 7 | 0.4 | 0.9 | 0.3 | 0.4 | 0.7 | $10^{-9}$ | 1.2 | Outside |

The metallizing composition according to the present invention has airtightness of not larger than $10^{-8}$ cc/sec and contact of not smaller than 1.5 kg/mm$^2$ in accordance with the above-mentioned evaluation methods, can properly metallize a surface of porcelain containing alumina of 96% or more by weight.

While the invention has been described in detail and with reference to specific embodiments thereof, it will be apparent to one skilled in the art that various changes and modifications can be made therein without departing from the spirit and scope thereof.

What is claimed is:

1. A metallizing composition consisting of 100 parts by weight of tungsten as a main component, from 2 to 12 parts by weight of $Al_2O_3$, from 0.1 to 0.8 part by weight of $Ta_2O_5$, from 0.3 to 1.5 parts by weight of $SiO_2$, and from 0.1 to 0.5 part by weight in total of CaO and MgO as an additive.

2. A metallizing composition according to claim 1, wherein the composition is applied to a porcelain containing alumina of 96% or more by weight.

3. A metallizing composition according to claim 1, wherein the composition is covered on a porcelain having airtightness of not larger than $10^{-8}$ cc/sec, and contact of not smaller than 1.5 kg/mm$^2$.